US 9,199,303 B2

(12) United States Patent
Yamaguchi et al.

(10) Patent No.: US 9,199,303 B2
(45) Date of Patent: Dec. 1, 2015

(54) METAL FILLING APPARATUS

(75) Inventors: Yukitaka Yamaguchi, Hyogo (JP);
Toshiji Takigawa, Hyogo (JP);
Toshihiro Hayami, Hyogo (JP); Osamu Imai, Hyogo (JP)

(73) Assignee: SUMITOMO Precision Products Co., Ltd., Hyogo (JP)

( * ) Notice: Subject to any disclaimer, the term of this patent is extended or adjusted under 35 U.S.C. 154(b) by 0 days.

(21) Appl. No.: 14/241,214

(22) PCT Filed: Sep. 4, 2012

(86) PCT No.: PCT/JP2012/072456
§ 371 (c)(1),
(2), (4) Date: Feb. 26, 2014

(87) PCT Pub. No.: WO2013/038952
PCT Pub. Date: Mar. 21, 2013

(65) Prior Publication Data
US 2014/0246163 A1  Sep. 4, 2014

(30) Foreign Application Priority Data

Sep. 14, 2011 (JP) .................. 2011-200093
Jul. 27, 2012 (JP) .................. 2012-167761

(51) Int. Cl.
*B22D 19/00* (2006.01)
*B22D 45/00* (2006.01)
(Continued)

(52) U.S. Cl.
CPC .............. *B22D 18/02* (2013.01); *B22D 19/00* (2013.01); *B22D 19/08* (2013.01); *B22D 39/02* (2013.01); *C23C 6/00* (2013.01); *H01L 21/67092* (2013.01); *H01L 21/76898* (2013.01)

(58) Field of Classification Search
CPC ........ B22D 18/02; B22D 19/00; B22D 45/00; C23C 6/00; H01L 21/28; H01L 21/288; H01L 21/3205; H01L 21/32051; H01L 21/768; H01L 21/76898
USPC ............... 164/75, 91, 98, 120, 319, 332, 113, 164/339, 61, 256; 228/33
See application file for complete search history.

(56) References Cited

U.S. PATENT DOCUMENTS 7,585,168 B2 *  9/2009  Kato et al. ..................... 425/186
7,980,445 B2 *  7/2011  Budd et al. ....................... 228/33
(Continued)

FOREIGN PATENT DOCUMENTS

| JP | 2002-368083 A | 12/2002 |
|----|---------------|---------|
| JP | 2003-139172 A | 5/2003 |
| JP | 4278007 B1 | 6/2009 |
| JP | 4505540 B1 | 7/2010 |

OTHER PUBLICATIONS

JPO machine translation of JP 2002-368083, Jun. 8, 2001.*

*Primary Examiner* — Kevin E Yoon
(74) *Attorney, Agent, or Firm* — Miller, Matthias & Hull LLP

(57) ABSTRACT

A metal filling apparatus minimizes the thickness of excess metal formed on an object and fills molten metal into a minute space to have an opening on the object. A table holds a semiconductor wafer, piston has a pressure portion on a side facing the table, and a pressing mechanism engages the piston onto the wafer, and an airtight chamber is formed by the wafer on the table, housing, and piston. A mechanism reduces pressure inside the chamber by exhausting gas, a mechanism supplies molten metal to the chamber, and a mechanism supplies an inert gas into the chamber.

17 Claims, 14 Drawing Sheets

(51) Int. Cl.
*B22D 18/02* (2006.01)
*B22D 19/08* (2006.01)
*B22D 39/02* (2006.01)
*H01L 21/67* (2006.01)
*H01L 21/768* (2006.01)
*C23C 6/00* (2006.01)

(56) References Cited

U.S. PATENT DOCUMENTS

2010/0126688 A1* 5/2010 Sekine et al. .................. 164/61
2010/0301485 A1* 12/2010 Sekine et al. ................ 257/769

* cited by examiner (a)

(b)

(a)

(b)

METAL FILLING APPARATUS

CROSS-REFERENCE TO RELATED APPLICATIONS

This application is a U.S. National Stage filing under 35 USC §371 of International Patent Application No. PCT/JP2012/072456 filed on Sep. 4, 2012. This application also claims priority under the Paris Convention to Japanese Application No. 2011-200093, filed on Sep. 14, 2011 and Japanese Application No. 2012-167761, filed on Jul. 27, 2012.

FIELD OF THE DISCLOSURE

The present invention relates to a metal filling apparatus for filling a molten metal into a minute space formed on a surface of an object to be processed.

BACKGROUND OF THE DISCLOSURE

In recent years, in the through silicon via technology, there has been desired a technique of filling a metal into a via or through hole (minute space) provided on a semiconductor wafer (object to be processed). Because the Through Silicon Via Technology makes it possible to develop a chip stacking technology using through hole electrode, it is expected that a high-performance and high-speed semiconductor system is achieved by a three-dimensional stacked integrated circuit.

Further, as a method of filling a metal into a minute space formed on an object to be processed as mentioned above, the method disclosed in the Japanese Unexamined Patent Application Publication No. 2002-368083 is known, for example.

In the method disclosed in the Japanese Unexamined Patent Application Publication No. 2002-368083, in a pressure-reduced chamber, a molten metal is supplied onto a surface of a sample, on which a minute space to be filled with the molten metal is formed, so that the molten metal covers the minute space, and then the molten metal is vacuum sucked into the minute space by pressurizing the vacuum chamber to a pressure equal to or greater than atmospheric pressure using an inert gas. According to this method, the molten metal can be vacuum sucked into the minute space formed on the object to be processed by pressure difference generated between the inside of the minute space and the inside of the vacuum chamber.

SUMMARY OF THE DISCLOSURE

By the way, in a case where the wettability between an object to be processed and a molten metal is poor, there is a problem that the molten metal supplied onto the object to be processed is repelled due to surface tension. Therefore, in the above-described conventional metal filling method, when supplying the molten metal to cover the minute space, the surface of the object to be processed has to be covered with a large amount of the molten metal. However, in the case where a large amount of the molten metal is supplied onto the object to be processed as described above, a thick layer of excess metal is formed on the object to be processed after processing and it is necessary to remove the layer in a later step.

Further, for supplying a large amount of the molten metal, increase in apparatus costs and running costs, such as enlargement of capacity of a heating system, construction of means for maintaining the properties of the molten metal and increase in the consumption of materials, is unavoidable.

The present invention has been achieved in view of the above-described circumstances and an object thereof is to provide a metal filling apparatus capable of minimizing the thickness of a layer of excess metal formed on an object to be processed after processing and capable of filling a molten metal into a minute space (via, through hole) formed to have an opening on a surface of the object to be processed.

The present invention relates to a metal filling apparatus which fills a molten metal into a minute space formed on a surface of an object to be processed to have an opening on said surface, the molten metal being supplied onto the object to be processed.

The metal filling apparatus comprises:
a holding portion holding the object to be processed;
a cylindrical member having an inner space and provided to have one end facing the holding portion;
a pressing member fitted into the inner space of the cylindrical member to be movable in a forward and backward direction;
a pressing mechanism moving the pressing member in the forward and backward direction with respect to the object to be processed held by the holding portion; and
a moving mechanism moving at least one of the holding portion and the cylindrical member in directions approaching and separating from the other thereof,
the object to be processed held by the holding portion or the holding portion, the cylindrical member and the pressing member together form an airtight processing chamber,
the metal filling apparatus further comprises:
a pressure reducing mechanism reducing the pressure inside the processing chamber;
a molten metal supply mechanism supplying a molten metal into the processing chamber; and
a pressurizing mechanism pressurizing the molten metal supplied into the processing chamber, and
the capacity of the processing chamber changes in accordance with the position of the pressing member in the forward and backward direction.

According to this metal filling apparatus, first, the moving mechanism brings the holding portion and the cylindrical member into a state where they are separated from each other, and then an object to be processed having a minute space formed on a surface thereof is arranged on the holding portion so that said surface faces the pressing member, and thereafter the moving mechanism causes the holding portion and the cylindrical member to approach each other, thereby bringing one end of the cylindrical member into contact with the object to be processed held by the holding portion or with the holding portion. Thereby, an airtight processing chamber surrounded by the object to be processed or the holding portion, the cylindrical member and the pressing member is formed. It is noted that, in a case where the specific gravity of the molten metal is greater than that of the object to be processed, the object to be processed can be prevented from floating up from the holding portion when supplying the molten metal into the processing chamber by the formation of the processing chamber formed by the object to be processed, the cylindrical member and the pressing member with the one end of the cylindrical member in contact with the object to be processed.

Thereafter, the gas inside the processing chamber is exhausted by the pressure reducing mechanism to reduce the pressure inside the processing chamber, and then a molten metal is supplied into the processing chamber (between the object to be processed and the pressing member) by the molten metal supply mechanism. Thereafter, the molten metal supplied into the processing chamber is pressurized by the pressurizing mechanism, thereby filing the molten metal into the minute space. It is noted that supplying the molten metal into the processing chamber after reducing the pressure inside the processing chamber as described above makes it possible to reduce the occurrence of a void.

Further, thereafter, in the metal filling apparatus, the pressing member is moved (forward) toward the object to be processed by the pressing mechanism and thereby is pressed onto the object to be processed. Thereby, the capacity of the processing chamber is reduced, or, in other words, the gap between the object to be processed and the pressing member is narrowed, and therefore excess molten metal on the object to be processed is pressed out from between the object to be processed and the pressing member. Therefore, it is possible to minimize the thickness of a layer of excess metal formed on the processed object after processing. It is noted that, at this time, the excess molten metal may be returned to the molten metal supply mechanism, or, if a space remains in the processing chamber after the supply of the molten metal, the excess molten metal may be pressed out into the remaining space.

Further, the pressurizing mechanism in the metal filling apparatus may be a pressurized gas supply mechanism which supplies a pressurized gas into the processing chamber. When thus configured, by supplying a pressurized gas into the processing chamber after the supply of the molten metal, the molten metal supplied into the processing chamber can be pressurized by the gas, and thereby the molten metal can be filled into the minute space by the so-called differential pressure filling. Furthermore, pressurizing the molten metal by the gas can prevent the molten metal from being repelled on the object to be processed.

Further, in the metal filling apparatus, the molten metal supply mechanism may be configured to supply a molten metal into the processing chamber so that the processing chamber is completely filled with the molten metal. When thus configured, the motel metal can be uniformly spread on the object to be processed without being repelled thereon. Further, because the molten metal supplied into the processing chamber can be pressurized by the pressing member by moving the pressing member toward the object to be processed with the processing chamber completely filled with the molten metal, it is possible to the press the molten metal into the minute space formed on the object to be processed. In this case, the pressing mechanism also functions as the pressurizing mechanism. Further, it is possible to press out excess molten metal from between the pressing member and the object to be processed by moving the pressing member toward the object to be processed. It is noted that the excess molten metal pressed out is returned to the molten metal supply mechanism. Furthermore, the amount of the molten metal necessary to completely fill the processing chamber can be reduced by supplying the molten metal after previously making the capacity of the processing chamber as small as possible by causing the pressing member to approach the object to be processed.

Further, the molten metal supply mechanism may be configured to pressurize and supply the molten metal into the processing chamber so that the processing chamber is completely filled with the molten metal. When thus configured, even when the wettability is very poor and the repelling force is very high, as described above, the molten metal can be uniformly spread on the object to be processed without being repelled thereon. Further, since the molten metal is pressurized and supplied into the processing chamber and the molten metal supplied into the processing chamber is pressurized by the pressure of the supply of the molten metal, the molten metal can be pressed into the minute space formed on the object to be processed. In this case, the molten metal supply mechanism also functions as the pressurizing mechanism.

Furthermore, it is preferred that the metal filling apparatus has a vent passage one end of which opens to the inner wall surface of the cylindrical member and a supply passage one end of which opens to the inner wall surface of the cylindrical member, the pressure reducing mechanism is configured to reduce the pressure inside the processing chamber by exhausting the gas inside the processing chamber through the vent passage, and the molten metal supply mechanism is configured to supply the molten metal into the processing chamber through the supply passage.

Further, the metal filling apparatus may have a configuration in which the metal filling apparatus has a vent passage that is formed on the pressing member so that one end thereof opens to the surface facing the holding portion of the pressing member and a supply passage that is formed on the pressing member so that one end thereof opens to the surface facing the holding portion of the pressing member, the pressure reducing mechanism is configured to reduce the pressure inside the processing chamber by exhausting the gas inside the processing chamber through the vent passage, and the molten metal supply mechanism is configured to supply the molten metal into the processing chamber through the supply passage.

Further, in the present invention, it is preferred that the metal filling apparatus has a molten metal sealing portion is formed on the pressing member, the molten metal sealing portion confining the molten metal supplied by the molten metal supply mechanism between the pressing member and the surface of the object to be processed. In this configuration, when pressing the pressing member onto the surface of the object to be processed, since the molten metal is confined between the pressing member and the surface of the object to be processed by the function of the molten metal sealing portion, it is possible to apply a high pressure to the entire of the surface to be processed of the object to be processed, and therefore it is possible to tightly fill the minute space formed on the object to be processed with the molten metal.

That is, because confining the molten metal between the pressing member and the object to be processed causes a state where the molten metal is sealed in almost all regions on the surface of the object to be processed, it is possible to press the molten metal into the minute space on the entire of the surface of the object to be processed by applying an appropriate pressure to the molten metal. Thereby, it is possible to tightly press the molten metal into the minute space and avoid the occurrence of a void at the time of filling, thereby achieving a highly accurate metal filling.

It is noted that, in the present invention, typically the minute space formed on the object to be processed is assumed to have a diameter of 0.1 μm to several tens of μm. Further, the method of forming the minute space and the morphological characteristics of the minute space such as aspect ratio do not matter as long as a molten metal can be filled thereinto, and it also does not matter whether or not the minute space is a through hole. Further, the shape thereof is not limited and the minute space may have any arbitrary shape, for example, a linear shape, a curved shape, a cranked shape or the like, and it also does not matter whether or not it has a branch. Furthermore, when the minute space is not a through hole, it may have an arbitrary depth equal to or lower than several hundreds of μm in accordance with the thickness of the object to be processed.

According to the metal filling apparatus of the present invention, it is possible to minimize the thickness of a layer of excess metal formed on an object to be processed after processing and fill a molten metal into a minute space (via, through hole) formed to have an opening on the object to be processed.

DETAILED DESCRIPTION

Hereinafter, a specific embodiment of the present invention will be described on the basis of the accompanying drawings.

[1. Configuration of Metal Filling Apparatus]

Figure 1:
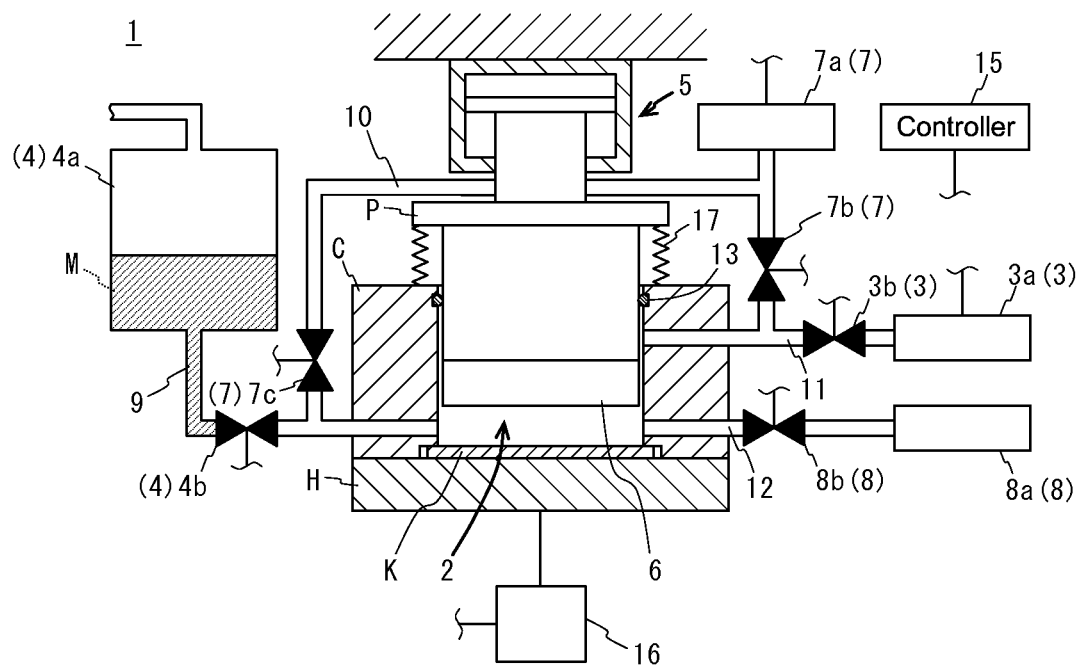
FIG. 1 is a sectional view showing a schematic configuration of a metal filling apparatus according to one embodiment of the present invention.

As shown in FIG. 1, a metal filling apparatus 1 of this embodiment is a metal filling apparatus for filling a molten metal M into a minute space formed on a surface of a semiconductor wafer (object to be processed) K to have an opening on said surface, and comprises a holding table H on which the semiconductor wafer K is held with said surface up, a cylindrical housing C having a space formed therein and disposed with a lower end surface thereof facing the holding table H, a piston P being a pressing member provided to be movable forward and backward with respect to said surface of the semiconductor wafer K held on the holding table H, a lifting mechanism 16 causing the holding table H to approach and separate from the housing C, and a pressing mechanism 5 moving the piston P forward and backward, and an airtight processing chamber 2 is formed by the semiconductor wafer K held on the holding table H, the housing C and the piston P.

Further, the metal filling apparatus 1 has a pressure reducing mechanism 3 exhausting the gas inside the processing chamber 2 to reduce the pressure inside the processing chamber 2, a molten metal supply mechanism 4 supplying the molten metal M into the processing chamber 2, a gas pressurizing mechanism 7 supplying an inert gas into the processing chamber 2, a molten metal recovery mechanism 8 recovering the molten metal M supplied into the processing chamber 2, and a controller 15 controlling operations of the lifting mechanism 16, the pressing mechanism 5, the pressure reducing mechanism 3, the molten metal supply mechanism 4, the gas pressurizing mechanism 7 and the molten metal recovery mechanism 8.

The holding table H is configured to be moved up and down by the lifting mechanism 16, and the airtight processing chamber 2 is formed by moving up the holding table H toward the housing C and bringing the top surface of the holding table H into contact with the lower end surface of the housing C. It is noted that the lifting mechanism 16 comprises a torque motor or the like and the operation thereof is controlled by the controller 15.

The piston P has a pressing portion 6 provided on the side facing the holding table H, the pressing portion 6 being made of stainless steel 440C (or stainless steel 304) having heat resistance. It is noted that, as a material of the pressing portion 6, stainless steel is excellent in that it has a stable surface state and a sufficient hardness even when it is used under a high-temperature environment. Further, the piston P is fitted into the housing C from the upper opening of the housing C and is configured to be moved forward and backward in the axial direction by the pressing mechanism 5. It is noted that an O-ring 13 is interposed between the outer peripheral surface of the piston P and the inner peripheral surface of the housing C and provides sealing between them. Further, a bellows seal 17 is provided between a flange portion of the piston P and the upper end surface of the housing C and the airtightness between the piston P and the housing C is further improved by the bellows seal 17.

Further, in the surface of the pressing portion 6, at least a region which comes into contact with the molten metal M is mirror finished by electro-polishing. As a result of such mirror finishing, as for the surface roughness of the pressing portion 6 in an experimentally manufactured metal filling apparatus 1, the 10-point average roughness (Rz) is equal to or lower than 0.3 um, the maximum height (Ry) is equal to or lower than 0.5 μm, and the unevenness average distance (Sm) is equal to or higher than 10 μm. By making the surface roughness (10-point average roughness) of the pressing portion 6 equal to or lower than 0.3 μm and thereby making the metallic surface of the pressing portion 6 smooth as described above, it is possible to prevent the molten metal M from sticking to the pressing portion 6, and therefore, when separating the pressing portion 6 from the semiconductor wafer K, the molten metal M which has been cooled and cured can be easily peeled from the metallic surface of the pressing portion 6, which makes it possible to effectively avoid defective filling, a crack in the semiconductor wafer K and the like.

It is noted that the surface roughness in this application indicates the 10-point average roughness defined by the JIS.

Further, DLC coating (releasing treatment) is performed on the surface of the pressing portion 6, and therefore, even if the pressing portion 6 is pressed onto the molten metal with a strong force, the molten metal M, even after being cured, can be easily peeled from the pressing portion 6.

As the mold release processing, besides DLC coating, CrN coating, TiN coating, the Surf Treatment (by Kanuc Corporation) and the like may be preferably used. Further, as described above, the pressing portion 6 is a metallic portion made of stainless steel and therefore has a sufficient hardness, and, in an experimentally manufactured metal filling apparatus 1, the pressing portion 6 had a micro-Vickers hardness (Hv) larger than 1200 in a state where the above-described mirror finishing or mold release processing had been performed thereon.

Further, because the metallic pressing portion 6 is relatively rarely deformed due to heating and pressurizing and it has a sufficient hardness as described above, a coating processing performed on the surface thereof is difficult to deteriorate and therefore it is possible to prolong the duration of the coating effect.

The pressing mechanism 5 is the so-called oil hydraulic cylinder mechanism and applies a driving force for moving the piston P forward and backward, and is capable of pressing the pressing portion 6 of the piston P onto the semiconductor wafer K with a predetermined pressing force. It is noted that, although not shown in the drawings, the pressing mechanism 5 has pipings connected thereto for supplying pressure oil into the upper and lower chambers shown in the drawings and a switching valve the operation of which is controlled by the controller is provided on each piping, and the piston P is moved downward when pressure oil is supplied into the upper chamber and is moved upward when pressure oil is supplied into the lower chamber.

The pressure reducing mechanism 3 comprises a vacuum pump 3a connected to the processing chamber 2 through a piping 11 provided passing through an upper end portion of the side wall of the housing C, and a control valve 3b provided between the vacuum pump 3a and the processing chamber 2 in the piping 11, and reduces the pressure inside the processing chamber 2 by exhausting the air inside the processing chamber 2 using the vacuum pump 3a. It is noted that the operation of the vacuum pump and the opening and closing of the control valve 3b are controlled by the controller 15.

Further, the molten metal supply mechanism 4 comprises a molten metal supply section 4a connected to the processing chamber 2 through a piping 9 provided passing through a lower-end side portion of the side wall of the housing C, and a control valve 4a provided between the molten metal supply section 4a and the processing chamber 2 in the piping 9, and supplies the molten metal M into the processing chamber 2 from the molten metal supply section 4a with a predetermined supply pressure, and the opening and closing of the control valve 4b is controlled by the controller 15.

In the molten metal supply section 4a, the molten metal M which is to be used for metal filling is heated with a temperature above its melting point and is stored in liquid form. In this embodiment, the molten metal M used for metal filling is a lead-free solder alloy having a melting point of about 200° C. Although metals having a relatively low melting point, such as solder alloys, are excellent in that they are easy to handle, the kind of the molten metal M in the present invention is not limited to solder alloys, and it is possible to employ an arbitrary metal, e.g., Au, Ag, Cu, Pt, Pd, Ir, Al, Ni, Sn, In, Bi, Zn and alloys including them, corresponding to the purpose of filling the minute space or the function of the minute space.

Further, the pressurized-gas supply mechanism 7 comprises a pressurized-gas supply section 7a connected to the piping 11 and the piping 9 via a piping 10, a control valve 7b provided between the piping 11 and the pressurized-gas supply section 7a in the piping 10, and a control valve 7c provided between the piping 9 and the pressurized-gas supply section 7a in the piping 10, and supplies an inert gas into the processing chamber 2 from the pressurized-gas supply section 7a through the piping 9, the piping 10 and the piping 11. It is noted that the operation of the pressurized-gas supply section 7a and the opening and closing of the two control valves 7b and 7c are controlled by the controller 15.

The molten metal recovery mechanism 8 comprises a molten metal recovery section 8a connected to the processing chamber 2 via a piping 12 provided passing through a lower end side portion of the side wall of the housing C, and a control valve 8b provided between the molten metal recovery section 8a and the processing chamber 2 in the piping 12, and recovers the molten metal within the processing chamber 2, and the opening and closing of the control valve 8b is controlled by the controller 15. It is noted that, as for the configuration of the molten metal recovery section 8a, a configuration comprising a recovery tank and an exhaust device connected to the recovery tank may be given as an example.

[2. Procedure of Metal Filling]

Next, a procedure of metal filling in the metal filling apparatus 1 of this embodiment will be described using FIGS. 2 to 8.

First, the holding table H is moved downward by controlling the operation of the lifting mechanism 16 by the controller 15 and thereby the top surface of the holding table H is separated from the lower end surface of the housing C, and then a semiconductor wafer K having a minute space formed on a surface thereof is placed on the holding table H with said surface up. Subsequently, the holding table H is moved upward toward the housing C by controlling the operation of the lifting mechanism 16 by the controller 15 and thereby the top surface of the holding table H is brought into contact with the lower end surface of the housing C, thereby forming the processing chamber 2. It is noted that, at this time, the lower end surface of the housing C is brought into contact with said surface of the semiconductor wafer K to press down the semiconductor wafer K on the holding table H.

Figure 2:
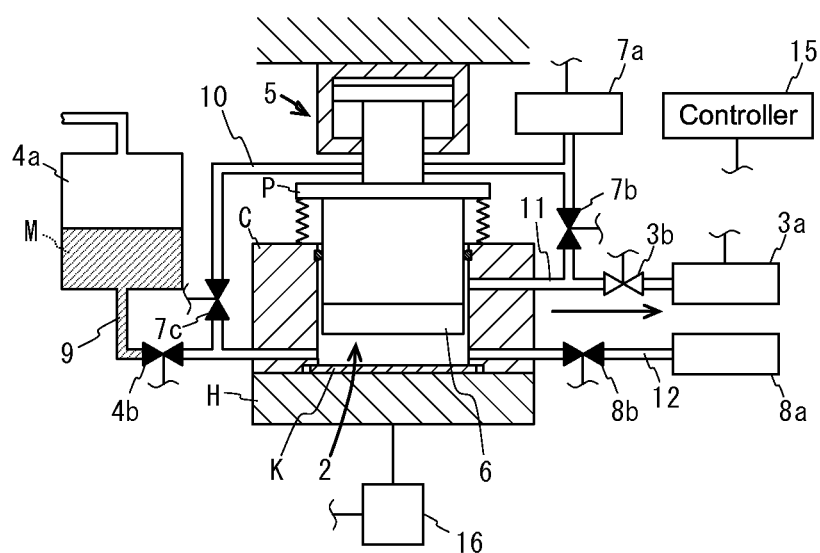
FIG. 2 is an illustration showing an operation flow of the metal filling apparatus according to the embodiment.

Thereafter, as shown in FIG. 2, under the control by the controller 15, the vacuum pump 3a is activated and the control valve 3b of the piping 11 is opened, and thereby the gas inside the processing chamber 2 is exhausted and the pressures inside the processing chamber 2 and the minute space are reduced to an almost vacuum state.

Figure 3:
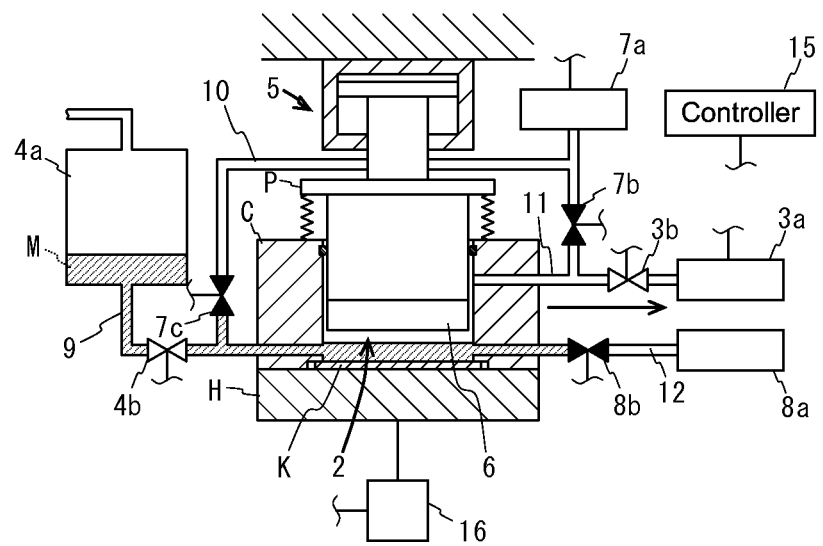
FIG. 3 is an illustration showing the operation flow of the metal filling apparatus according to the embodiment.

Next, as shown in FIG. 3, while the reduction of pressure by the vacuum pump 3a is continued to maintain the inside of the processing chamber 2 at the almost vacuum state, the control valve 4b of the piping 9 is opened by the controller 15 and the molten metal M in liquid form which has been heated to a temperature equal to or higher than its melting point is supplied into the processing chamber 2 from the molten metal supply section 4a until the amount of the molten metal M reaches an amount capable of covering the entire of said surface of the semiconductor wafer K without being repelled on said surface of the semiconductor wafer K. It is noted that, although, in the metal filling apparatus 1, it is possible to supply the molten metal M while continuing the reduction of pressure by the vacuum pump 3a because the piping 11 is provided passing through the upper end portion of the housing C, that is, the piping 11 is provided at a position sufficiently higher than the liquid surface of the supplied molten metal, it is preferred that the supply of the molten metal M is stopped at an appropriate timing so that the molten metal M is not sucked into the vacuum pump 3a. Further, pressing down the semiconductor wafer K on the holding table H as described above prevents the semiconductor wafer from floating up from the holding table H even in a case where, for example, a solder alloy (specific gravity: about 9.0) is supplied onto a semiconductor wafer made of silicon (specific gravity: about 2.5).

Further, because it is not preferred that the molten metal M is cooled and cured before entering a pressing step which will described later, in this step, it is necessary to keep the temperature of the inside of the processing chamber 2 equal to or higher than the melting point of the molten metal M by an appropriate heating mechanism so that the molten metal M remains in liquid form.

Figure 4:
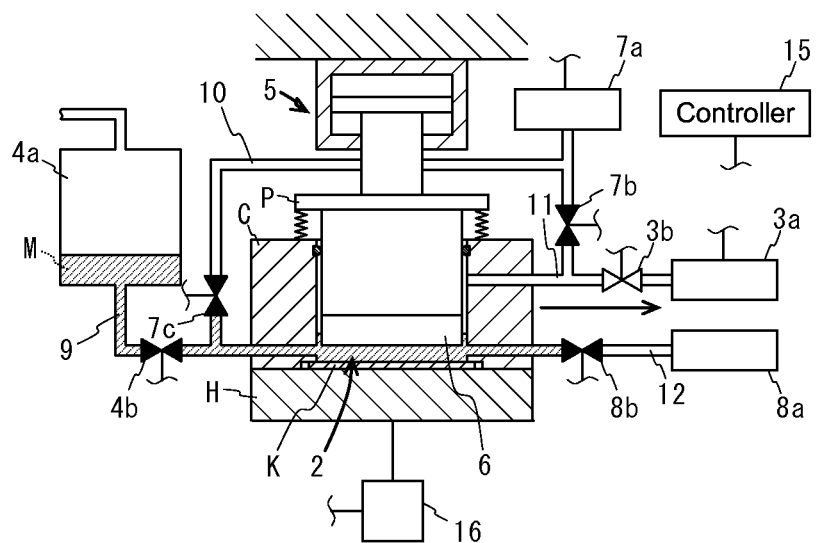
FIG. 4 is an illustration showing the operation flow of the metal filling apparatus according to the embodiment.

After supplying a sufficient amount of the molten metal M into the processing chamber 2, as shown in FIG. 4, the control valve 4b of the piping 9 is closed by the controller 15 and then, under the control by the controller 15, the pressing mechanism 5 is driven to move the piston P in the processing chamber 2 slowly toward the semiconductor wafer K to bring the piston P closer to the semiconductor wafer K, and thereby the surface of the pressing portion 6 is sunk into the molten metal M supplied into the processing chamber 2. By sinking the surface of the pressing portion 6 into the molten metal M with the inside of the processing chamber 2 in the almost vacuum state in this way, it is possible to avoid the occurrence of a gaseous layer between the pressing portion 6 and the molten metal M.

Figure 5:
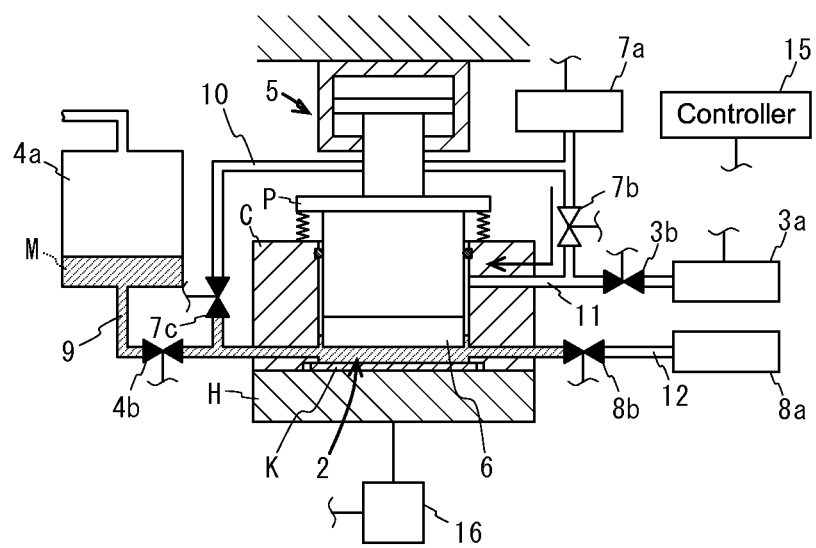
FIG. 5 is an illustration showing the operation flow of the metal filling apparatus according to the embodiment.

Next, as shown in FIG. 5, in the state where the surface of the pressing portion 6 is being sunk in the molten metal M, the control valve 3b of the piping 11 is closed by the controller 15 and the operation of the vacuum pump 3a is stopped to stop the reduction of pressure, and, on the other hand, under the control by the controller 15, the control valve 7b of the piping 10 is opened and the pressurized-gas supply section 7a is activated to supply nitrogen gas or the like for pressurization into the processing chamber 2 from the pressurized-gas supply section 7a, and thereby the molten metal M is pressurized by the gas pressure and is filled into the minute space by the so-called differential pressure filling.

Figure 6:
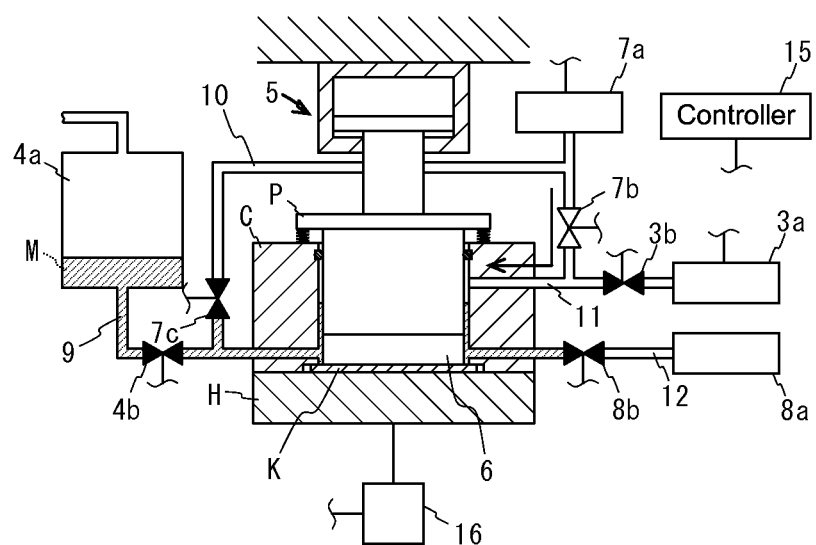
FIG. 6 is an illustration showing the operation flow of the metal filling apparatus according to the embodiment.

Subsequently, as shown in FIG. 6, the pressing mechanism 5 is driven by the controller 15 to further move the piston P toward the semiconductor wafer K, thereby pressing the pressing portion 6 onto the surface of the semiconductor wafer K. Thereby, excess molten metal between the pressing portion 6 and the semiconductor wafer K is pressed out from the surface of the semiconductor wafer K into a gap between the inner peripheral surface of the housing C and the outer peripheral surface of the piston P. Therefore, the amount of residue formed on the surface of the semiconductor wafer K after processing is reduced. It is noted that the residue means a layer-shaped unnecessary metallic portion formed on the semiconductor wafer K due to curing of excess molten metal which cannot enter the minute space on the semiconductor wafer K, but the metallic portion is not always unnecessary and there is a case where it can be used as a wiring layer or a contact layer.

Thereafter, the pressing portion 6 is kept stationary for a while in a state of being pressed onto the surface of the semiconductor wafer K. In the metal filling apparatus 1 of this embodiment, as described above, the molten metal M is moved into the gap between the inner peripheral surface of the housing C and the outer peripheral surface of the piston P as the pressing portion 6 is pressed into the molten metal M liquid, and therefore the liquid surface of the molten metal M rises. As a result thereof, the semiconductor wafer K is brought into a state of being immersed in the motel metal M at a position deep from the liquid surface of the molten metal M, and therefore, even if a situation occurs where the pressing portion 6 comes into contact with the semiconductor wafer K and the force of repelling of the molten metal M on the surface of the semiconductor wafer K is strong due to poor wettability of the molten metal M with respect to the semiconductor wafer K and the pressing portion 6, film brake of the molten metal M on the surface of the semiconductor wafer K hardly occurs. It is noted that it is preferred that the gas pressurization by the pressurized-gas supply section 7 is continued also while the pressing portion 6 is being pressed onto the surface of the semiconductor wafer K. Thereby, the filling force is maintained and the above-described film break can be prevented efficiently.

Figure 7:
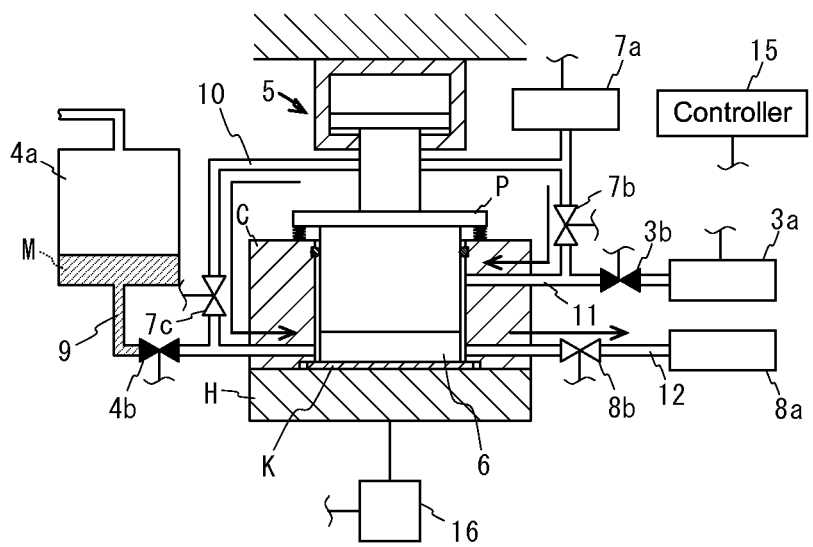
FIG. 7 is an illustration showing the operation flow of the metal filling apparatus according to the embodiment.

Subsequently, as shown in FIG. 7, in the state where the pressing portion 6 is being pressed onto the surface of the semiconductor wafer K, the control valve 7c of the piping 10 and the control valve 8b of the piping 12 are opened by the controller 15, thereby recovering excess molten metal M which cannot be filled into the minute space of the semiconductor wafer K into the molten metal recovery section 8a. If excess molten metal M is not recovered, after a cooling process which will be described later, there occur problems such as that the excess molten metal M is cured in a gap between the housing C and the pressing portion 6 and thereby prevents the upward and downward movement of the piston P, and that the semiconductor wafer K and the wall surface of the processing chamber 2 stick to each other. However, because defective filling occurs if a gas enters between the pressing portion 6 and the semiconductor wafer K, excess metal shall not be completely discharged but the molten metal M shall be left in a gap between the side wall of the pressing portion 6 and the inner wall of the housing C. Although the amount of the molten metal M left in the gap depends on the wettability of the molten metal M with respect to the semiconductor wafer K and the pressing portion 6 and depends on the size of the gap, it is preferred that the molten metal M remains with a height of several mm.

After recovering the excess molten metal M, under the control by the controller 15, the two control valves 7b, 7c of the piping 10 are closed to stop the supply of the gas for pressurization and the control valve 8b of the piping 12 is also closed. Thereafter, the heating or maintenance of temperature of the inside of the processing chamber 2 is stopped and the processing chamber 2 is cooled until the temperature of the molten metal M becomes equal to or lower than its melting point, and the molten metal M filled into the minute space of the semiconductor wafer K is waited for to be cooled and cured.

Figure 8:
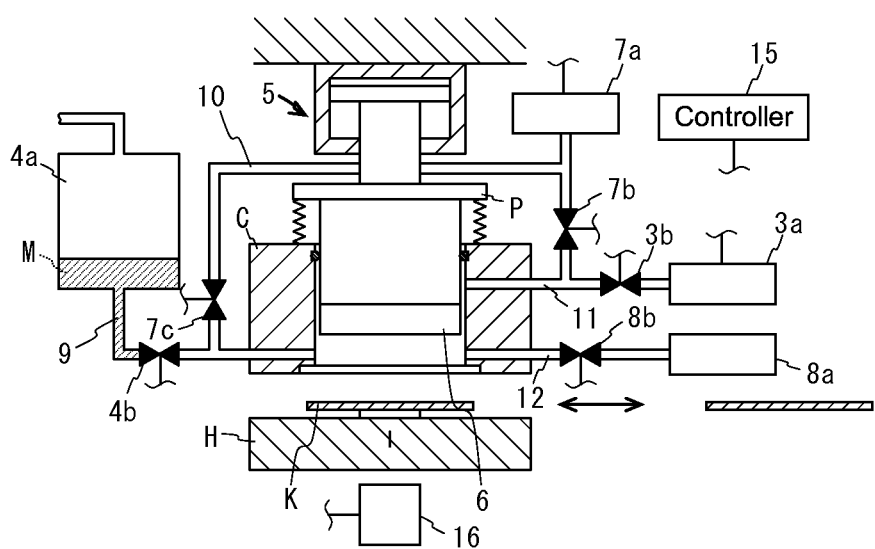
FIG. 8 is an illustration showing the operation flow of the metal filling apparatus according to the embodiment.

Next, as shown in FIG. 8, under the control by the controller 15, the pressing mechanism 5 is driven to slowly move the piston P upward and further the lifting mechanism 16 is driven to move the holding table H downward, thereby releasing the processing chamber 2. Then, the semiconductor wafer K on which the metal filling processing has been finished is detached from the holding table H and replaced with a new semiconductor wafer K on which the metal filling processing is to be performed next. In a case where the metal filling processing is performed on a plurality of semiconductor wafers K, the procedure as shown in FIGS. 2 to 8 is repeated as appropriate.

[3. Mode of Providing a Molten Metal Sealing Portion]

Next, as a preferred embodiment, a configuration example in which, in the above-described configuration, a molten metal sealing portion is provided for confining the molten metal M supplied by the molten metal supply mechanism 4 between the pressing portion 6 and the semiconductor wafer K will be explained.

Figure 9:
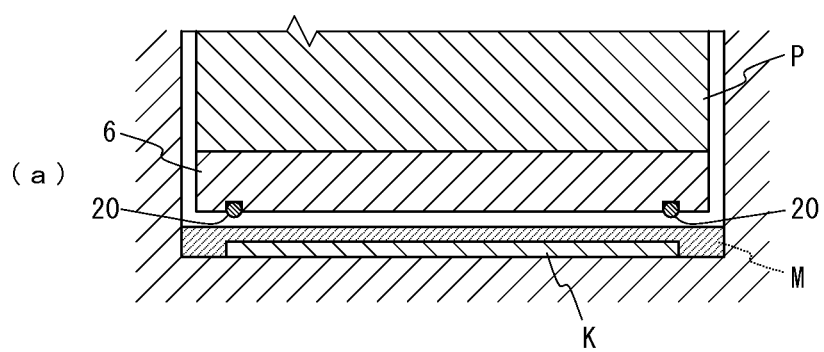
FIG. 9 shows (a) a sectional view showing a configuration example in which a molten metal sealing portion is provided on a piston and (b) a sectional view showing a state where the piston shown in (a) is moved downward toward a semiconductor wafer.
Figure 9:
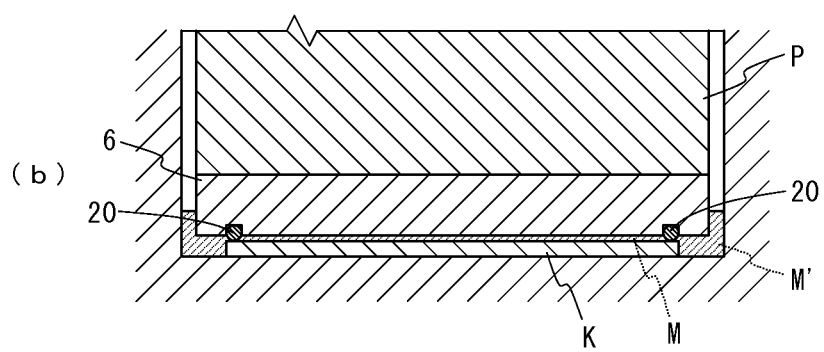
Figure 10:
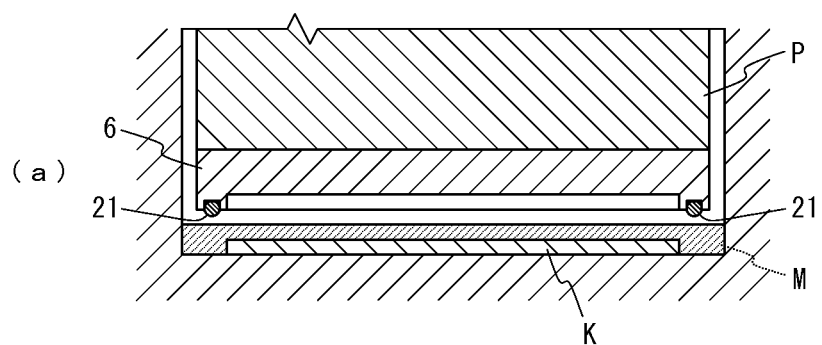
FIG. 10 shows a sectional view showing another configuration example in which a molten metal sealing portion is provided on a piston and (b) a sectional view showing a state where the piston shown in (a) is moved downward toward a semiconductor wafer.
Figure 10:
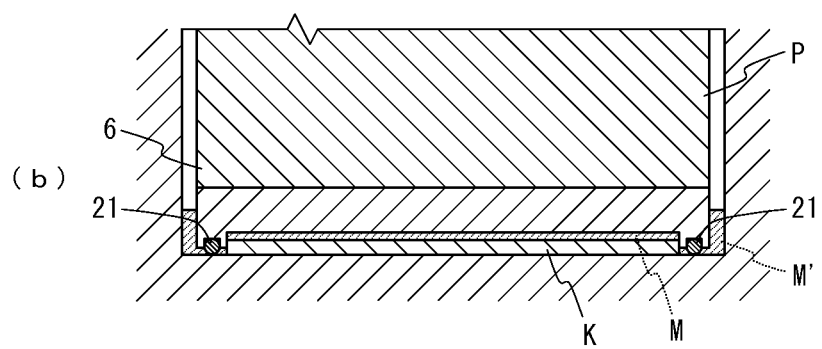
Figure 11:
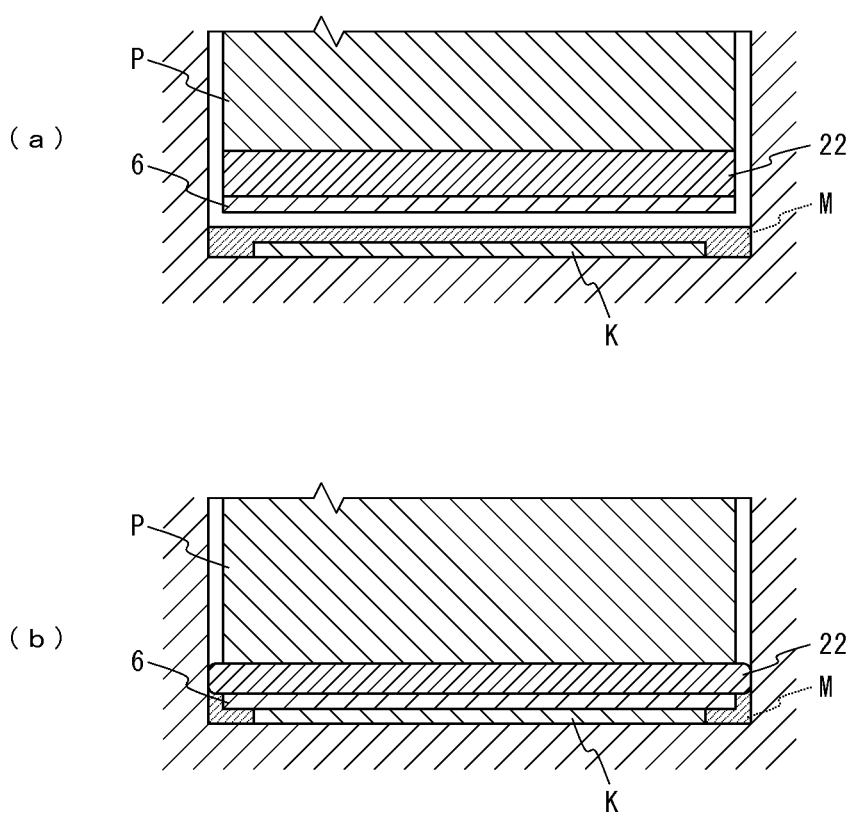
FIG. 11 shows (a) a sectional view showing another configuration example of the molten metal sealing portion provided on the piston and (b) a sectional view showing a state where the piston shown in (a) is moved downward toward a semiconductor wafer.
Figure 12:
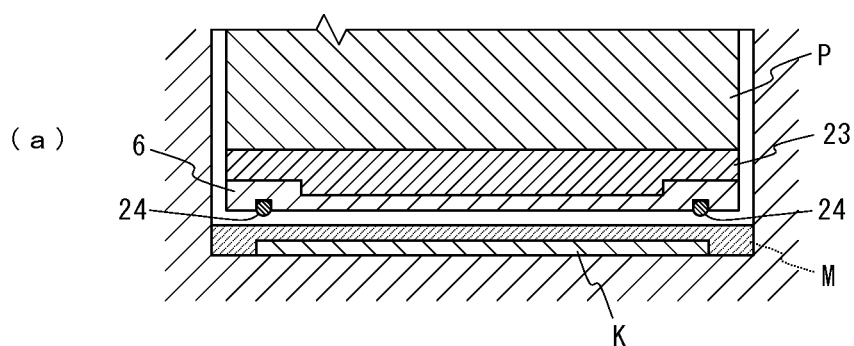
FIG. 12 shows (a) a sectional view showing another configuration example of the molten metal sealing portion provided on the piston and (b) a sectional view showing a state where the piston shown in (a) is moved downward toward a semiconductor wafer.
Figure 12:
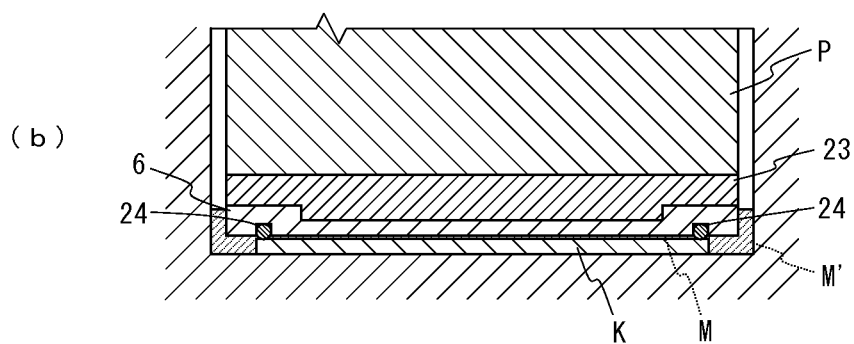
Figure 13:
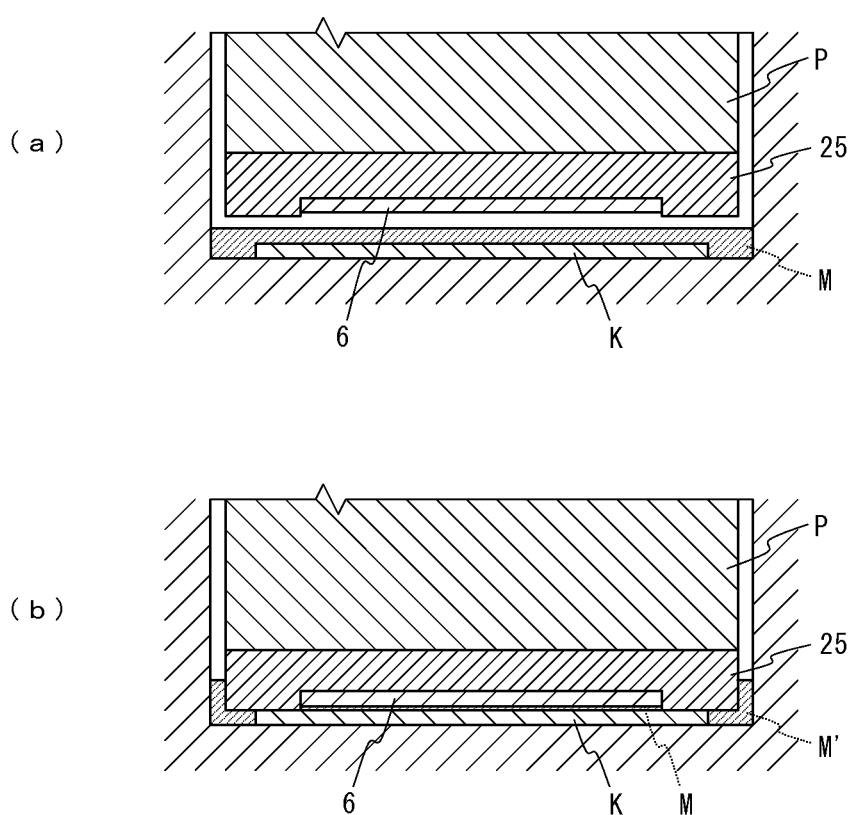
FIG. 13 shows (a) a sectional view showing another configuration example of the molten metal sealing portion provided on the piston and (b) a sectional view showing a state where the piston shown in (a) is moved downward toward a semiconductor wafer.

First, as a first mode of providing the molten metal sealing portion, as shown in FIG. 9(a), there is a mode in which a ring-shaped sealing portion 20 (molten metal sealing portion) comprising an elastomer is provided in the lower surface of the pressing portion 6 so that it is located along the outer periphery of the circular semiconductor wafer K. In FIG. 9(a), the configuration of the hatched wall thick portion is omitted (the same is applied to FIGS. 10 to 13).

According to this configuration, when the pressing portion 6 is caused to approach the semiconductor wafer K (see FIG. 6), the amount of excess molten metal M which is to be residue on the semiconductor wafer K can be sufficiently reduced by releasing excess molten metal M to the outside. That is, the molten metal M in a region inside the sealing portion 20 can be released to the outside of the region until the sealing portion 20 comes into contact with the semiconductor wafer K, while the molten metal M is confined in the region inside the sealing portion 20 when the sealing portion 20 further approaches the semiconductor wafer K and comes into surface contact with the surface of the semiconductor wafer K (see FIG. 9(b)).

Providing the sealing portion 20, particularly the sealing portion 20 comprising an elastomer, makes it possible to obtain good sealability. Further, because the sealing portion 20 is deformed by pressing the pressing portion 6 and thereby the sealed region is narrowed, it is possible to efficiently apply a high pressure to the molten metal M within the sealed region using the thrust of the pressing mechanism 5, and therefore it is possible to tightly fill the molten metal M into the minute space on the surface of the semiconductor wafer K.

In this embodiment, performing pressurization in two steps, the gas pressurization and the pressurization by the pressing portion 6 having the sealing portion 20, makes it possible to perform metal filling even when the wettability of the molten metal M with respect to the semiconductor wafer K is poor. Specifically, the gas pressurization is performed first, and the gas pressure at this time is set to such a small pressure (for example, a pressure equal to or lower than 0.2 MPa) that there is no film break of the molten metal M in a gap between the semiconductor wafer K and the pressing portion 6. Then, a high pressure is applied to the molten metal M on the entire of the surface to be processed of the semiconductor wafer K located inside the sealing portion 20 by pressing the pressing portion 6 having the sealing portion 20, thereby performing the filling processing. When this method is employed, it is possible to achieve an effective metal filling by the two-step pressurization comprising gas pressurization and pressurization by pressing without making the pressure vessel performance of the processing chamber extremely high.

Further, when using the pressing portion 6 having the sealing portion 20, in the subsequent excess molten metal discharging step, even if excess molten metal M' outside the sealed range is discharged using gas blow or a liquid rinse, the fillingness of the minute space within the sealed range is not affected, and therefore it is possible to more efficiently recover excess molten metal. That is, in this embodiment, since the sealing portion 20 is provided, unlike the metal filling apparatus 1, even if excess molten metal M' is completely discharged, defective filling due to entrance of gas between the pressing portion 6 and the semiconductor wafer K does not occur and therefore it is possible to keep regions outside the sealed range clean.

Further, as a second mode of providing the molten metal sealing portion, as shown in FIG. 10(a), there is a mode in which a sealing portion 21 (molten metal sealing portion) comprising a circular elastomer concentric with the circular semiconductor wafer K is provided at a position facing the holding table H outside the semiconductor wafer K in the lower surface of the pressing portion 6.

According to this configuration, because the sealing portion 21 is provided outside the semiconductor wafer K, the sealing portion 21 never comes into contact with the semiconductor wafer K and therefore it is possible to perform the processing of filling the molten metal M on the entire of the surface of the semiconductor wafer K (see FIG. 10(b)).

Although the materials forming the above-described molten metal sealing portions are not particularly limited as long as they have some degree of elasticity and heat resistance and are suitable for sealing, employing a material or configuration which allows the molten metal M before sealing to easily escape to the outside makes it possible to minimize the amount of the molten metal M sealed and thereby making residue formed on the semiconductor wafer K thin.

Next, as a third mode of providing the molten metal sealing portion, as shown in FIG. 11(a), there is a mode in which an elastomer layer 22 (molten metal sealing portion) is laminated on the surface opposite to the surface to be brought into contact with the molten metal M of the pressing portion 6. In this case, when the piston P is moved toward the semiconductor wafer K by the pressing mechanism 5 and thereby the pressing portion 6 is brought closer to the molten metal M and the semiconductor wafer K, as shown in FIG. 11(b), the elastomer layer 22 is expanded in a planar shape perpendicular to the pressing direction and the expanded elastomer layer 22 comes into contact with the housing C, and thereby the molten metal M is confined in a space sealed by the elastomer layer 22. According to this configuration, the sealing is performed so that the pressure of the molten metal M which has been previously pressurized by gas pressurization is maintained.

Further, in this configuration, even when the parallelism between the surface of the semiconductor wafer K and the surface of the pressing portion 6 is bad, it is possible to efficiently cause the surface of the semiconductor wafer K and the surface of the pressing portion 6 to adhere to each other by the deformation of the elastomer layer 22. Further, by forming the metallic portion of the pressing portion 6 from a thin plate which is easily deformed, even when the flatness of the surface of the semiconductor wafer K is bad, it is possible to efficiently cause the surface of the semiconductor wafer K and the surface of the pressing portion 6 to adhere to each other by the deformation of the elastomer layer 22 and deformation of the metallic thin plate, and then perform cooling while maintaining pressure to cure the molten metal M, and therefore it is possible to make residue formed on the semiconductor wafer K thinner by the adhesion effect.

Next, as a fourth mode of providing the molten metal sealing portion, as shown in FIG. 12(a), there is a mode in which an elastomer layer 23 (molten metal sealing portion) is laminated on the surface opposite to the surface to be brought into contact with the semiconductor wafer K of the pressing portion 6 and a ring-shaped sealing portion 24 (molten metal sealing portion) comprising an elastomer is provided in the lower surface of the pressing portion 6 so that it is located along the outer periphery of the circular semiconductor wafer K. In this case, when the piston P is moved toward the semiconductor wafer K by the pressing mechanism 5 and thereby the pressing portion 6 is brought closer to the molten metal M and the semiconductor wafer K and the sealing portion 24 is brought into contact with the semiconductor wafer K, as shown in FIG. 12(b), the molten metal M is sealed in a region surrounded by the sealing portion 24. According to this mode, as compared with the third mode, the practical sealed range is narrowed to the region of the semiconductor wafer K, which makes it possible to reduce the amount of remaining metal which remains in an extra gap by recovering excess molten metal M' outside the region surrounded by the sealing portion 24 by the molten metal recovery mechanism as appropriate.

Next, as a fifth mode of providing the molten metal sealing portion, as shown in FIG. 13(a), there is a mode in which, on the piston P, an elastomer layer 25 (molten metal sealing portion) is laminated from an outer region of the surface to be brought into contact with the molten metal M of the pressing portion 6 to the opposite surface thereof. In this case, when the piston P is moved toward the semiconductor wafer K by the pressing mechanism 5 and thereby the pressing portion 6 is brought closer to the molten metal M and the semiconductor wafer K and the elastomer layer 25 is brought into contact with the semiconductor wafer K, as shown in FIG. 13(b), the molten metal M is sealed within the contact region of the elastomer layer 25. It is noted that, unlike the mode shown in FIG. 11, molten metal M' in the gap between the pressing portion 6 and the housing C is not sealed.

As described above, providing various molten metal sealing portions makes it possible to confine the molten metal M between the pressing portion 6 and the semiconductor wafer K and improve the sealability in a large region on the semiconductor wafer K, and therefore it is possible to apply an appropriate pressure to the molten metal M to press the molten metal M into the minute space of the semiconductor wafer K. Further, it is possible to reduce residue generated on the semiconductor wafer K, and in a case where a mode in which the molten metal M is sealed only within the region on the semiconductor wafer K is employed, it is possible to reduce the amount of excess molten metal remaining the processing chamber by recovering molten metal M' outside the region surrounded by the molten metal sealing portion by the molten metal recovery mechanism.

Thereby, it is possible to tightly press the molten metal into the minute space and avoid the occurrence of a void at the time of filling, thereby achieving a highly accurate metal filling.

Figure 14:
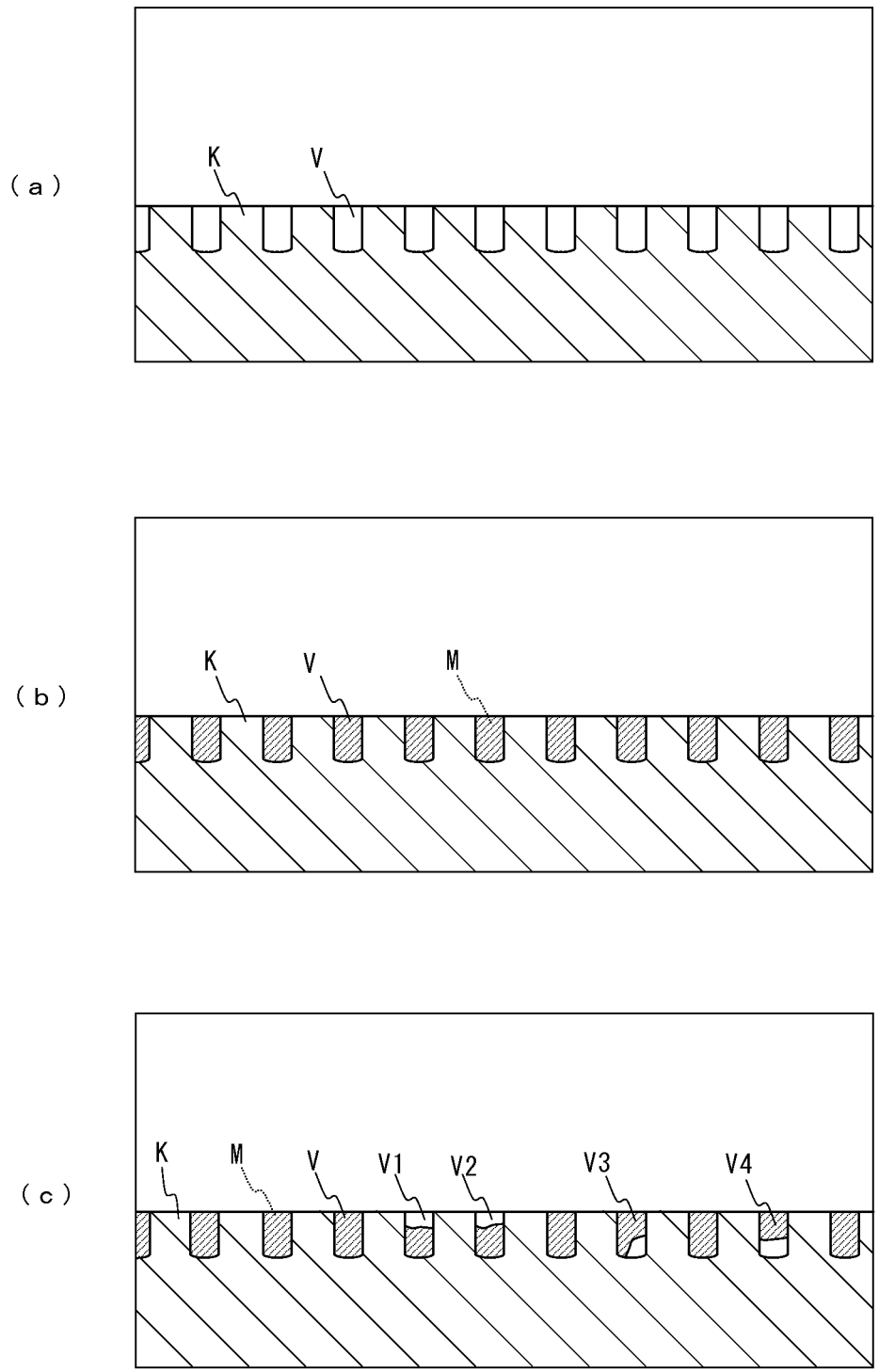
FIG. 14 shows (a) a sectional view showing minute spaces on a semiconductor wafer before metal filling, (b) a sectional view showing the minute spaces into which a metal has been favorably filled, and (c) a sectional view showing the minute spaces in which defective filling occurs.

Finally, a state where metal filling is favorably performed according to the present invention is shown in the drawings. FIG. 14(a) is a sectional view showing minute spaces V on a semiconductor wafer K before filling a molten metal M thereinto, and the lower portion in the figure is the semiconductor wafer K. In FIG. 14(a), uncountable numbers of minute spaces V are regularly arranged on the surface of the semiconductor wafer K. FIG. 14(b) is a sectional view showing a state where the molten metal M has been favorably filled into the minute spaces V on the semiconductor wafer K according to the present invention. In FIG. 14(b), it is seen that the molten metal M is tightly filled into the minute spaces V.

On the other hand, FIG. 14(c) is a sectional view showing minute spaces V1 to V4 where defective filling of the molten metal M occurs, as a comparison example. In FIG. 14(c), in the minute spaces V1, V2, although the molten metal M is filled in bottom portions thereof, the minute spaces are not completely filled because the amount of the molten metal M is not sufficient. Further, it is seen that the molten metal M does not reach bottom portions of the minute spaces V3, V4 and defective filling occurs there.

Thus, one embodiment of the present invention has been described, but a specific embodiment in which the present invention can be realized is not limited thereto.

For example, the above embodiment employs the configuration in which the pressing portion 6 is caused to approach the semiconductor wafer K, but the configuration is not limited thereto and a configuration in which the semiconductor wafer K (holding table H) is caused to approach the pressing portion 6 may be employed.

Further, in the above embodiment, the method in which the pressing portion 6 is brought into a state of being sunk in the molten metal M by, after supplying the molten metal M, moving the piston P toward the semiconductor wafer K and thereby causing the pressing portion 6 to approach the liquid surface of the molten metal M was explained, but the pressing portion 6 may be brought into a state of being sunk in the molten metal M by supplying the molten metal M until the surface of the pressing portion 6 is immersed in the molten metal M instead of by causing the pressing portion 6 to approach the liquid surface of the molten metal M.

Further, the pressing direction of the pressing portion 6 is not limited to the pressing in the vertically downward direction, and depending on the configuration of the apparatus, it may be pressing in a vertically upward direction or pressing in a horizontal direction. Furthermore, the direction of the metal filling apparatus is not limited to the direction as shown in FIG. 1, and the apparatus shown in FIG. 1 may be laid on its side or may be turned upside down.

Further, although the metal filling apparatus 1 of the above embodiment has the configuration in which a certain large amount of the molten metal M is supplied into the processing chamber 2 and thereby the entire surface of the semiconductor wafer K is uniformly covered by the molten metal, the apparatus 1 may have a configuration in which the capacity of the processing chamber 2 is previously set to be smaller and the molten metal M is supplied into the processing chamber so that the molten metal M completely fills the processing chamber 2, and thereby the entire surface of the semiconductor wafer K is uniformly covered by the molten metal M. A metal filling apparatus thus configured will be described below with reference to FIG. 15. It is noted that the same components as those of the metal filling apparatus 1 are indicated by the same references and detail explanations thereof are omitted.

Figure 15:
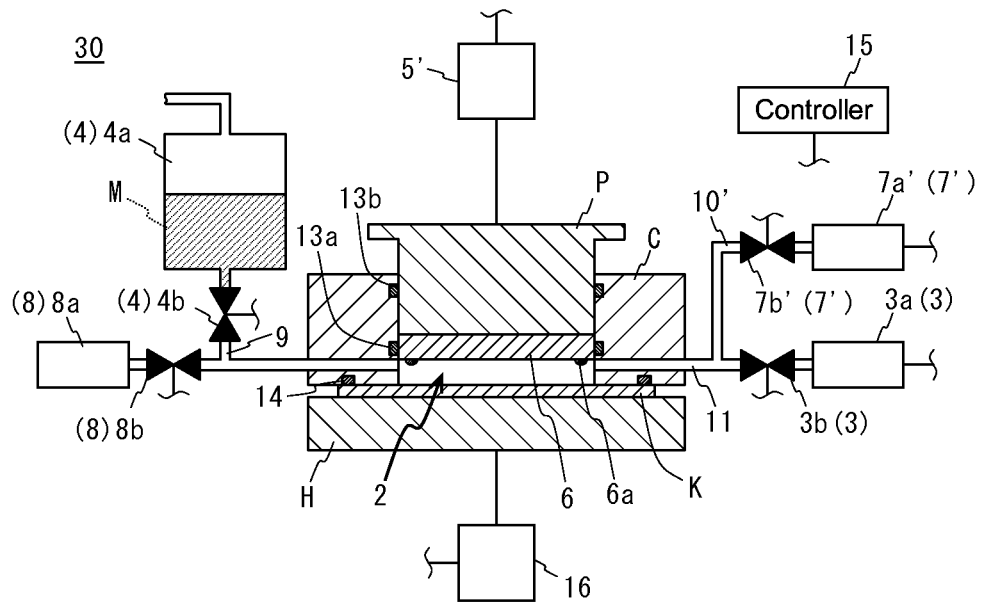
FIG. 15 is a sectional view showing a schematic configuration of a metal filling apparatus according to another embodiment of the present invention.

A metal filling apparatus 30 as shown in FIG. 15 has a holding table H, a housing C, a piston P, a lifting mechanism 16, a pressure reducing mechanism 3, a molten metal supply mechanism 4, a molten metal recovery mechanism 8, and a controller 15, and additionally has a pressing and pressurizing mechanism 5' which moves the piston forward and backward with respect to a semiconductor wafer K held on the holding table H and a gas feeding mechanism 7' which supplies an inert gas into the processing chamber 2. It is noted that the operations of the pressing and pressurizing mechanism 5' and the gas feeding mechanism 7' are controlled by the controller 15. Further, the pressing and pressurizing mechanism 5' is a component which is embodied as a pressing mechanism also functioning as a pressurizing mechanism.

The piston P is, similarly to the piston P of the metal filling apparatus 1, has a pressing portion 6 made of stainless steel 440C provided on the side facing the holding table H, and further the pressing portion 6 has a molten metal sealing portion 6a provided on an outer peripheral portion of the surface facing the holding table H. It is noted that two O-rings 13a, 13b are interposed between the piston P and the housing C and these two O-rings 13a, 13b are fixed on the housing C.

Further, the gas feeding mechanism 7' supplies an inert gas into the processing chamber 2 and feeds excess molten metal within the processing chamber 2 to a molten metal recovery section 8a of the molten metal recovery mechanism 8, and comprises a gas supply section 7a' supplying an inert gas, a piping 10' connecting the gas supply section 7a' and a piping 11, an a control valve 7b' provided between the gas supply section 7a' and the piping 11 in the piping 10', and the operation of the gas supply section 7a' and the opening and closing of the control valve 7b' are controlled by the controller 15. It is noted that, in the metal filling apparatus 30, the piping 11 is provided passing through a lower end portion of the side wall of the housing C.

Furthermore, in the metal filling apparatus 30, the operation of the lifting mechanism 16 is controlled by the controller 15 and thereby the holding table H is moved upward and the lower end surface of the housing C and the surface of the semiconductor wafer K held on the holding table H are brought into contact with each other, thereby forming a processing chamber 2. It is noted that, when forming the processing chamber 2, the airtightness between the lower end surface of the housing C and the surface of the semiconductor wafer K is maintained by an O-ring 14.

It is noted that the control valve 8b of the molten metal recovery mechanism 8 is switchable among three states of a closed state, a throttle-through open state and a full open state.

According to this metal filling apparatus 30, first, in a state where the holding table H and the housing C are separated from each other, a semiconductor wafer K is placed on the holding table H, and, under the control by the controller 15, the lifting mechanism 16 is driven and thereby the holding table H is moved upward toward the housing C and the surface of the semiconductor wafer K placed on the holding table H is brought into contact with the lower end surface of the housing C, thereby forming the processing chamber 2.

Subsequently, under the control by the controller 15, the pressing and pressurizing mechanism 5' is driven and thereby the piston P is brought closer to the semiconductor wafer K held on the holding table H so that the capacity of the processing chamber 2 becomes as small as possible, and then the control valve 3b is opened by the controller 15 and the vacuum pump 3a is driven to reduce the pressure inside the processing chamber 2 to an almost vacuum state. Thereafter, the control valve 3b is closed by the controller 15 and the operation of the vacuum pump 3a is stopped, while a control valve 4b is opened to pressurize and supply the molten metal M into the processing chamber 2. Then, after completely filling the processing chamber 2 with the molten metal M, the control valve 4b is closed by the controller 15 to stop the supply of the molten metal M into the processing chamber 2. In this way, since the processing chamber 2 is completely filled with the molten metal M, the molten metal M is not repelled on the surface of the semiconductor wafer K and the surface of the semiconductor wafer K is uniformly covered by the molten metal M. It is noted that, since the airtightness between the lower end surface of the housing C and the surface of the semiconductor wafer K is maintained by interposing the O-ring 14 between them as described above, when supplying the molten metal M into the processing chamber 2, the molten metal is prevented from entering under the semiconductor wafer K.

After stopping the supply of the molten metal M into the processing chamber 2, the control valve 8b is brought into the throttle-through open state by the controller 15, and, under the control by the controller 15, the pressing and pressurizing mechanism 5' is driven to move the piston P toward the semiconductor wafer K. At this time, since the control valve 8b is in the throttle-through open state, due to the movement of the piston P, excess molten metal M is pressed out to the molten metal recovery section 8a in a state where the molten metal M is appropriately pressurized. Then, the molten metal sealing portion 6a is brought into contact with the surface of the semiconductor wafer K by further moving the piston P, and thereby the molten metal M is confined in the region inside the molten metal sealing portion 6a and a higher pressure is applied to the semiconductor wafer K within the region inside the molten metal sealing portion 6a, thereby pressing the molten metal M into the minute space of the semiconductor wafer K.

Thereafter, the control valve 8b is brought into the full open state by the controller 15, and the control valve 7b' is opened and the gas supply section 7a' is activated and thereby an inert gas is supplied into the processing chamber 2 from the supply section 7a', and excess molten metal M' remaining in regions other than the region inside the molten metal sealing portion 6a is discharged to the molten metal recovery section 8a. It is noted that, in this discharging step, because the molten metal recovery section 8a is maintained at almost atmospheric pressure, the excess molten metal M is easily discharged to the molten metal recovery section 8a even with a low gas pressure. After discharging the excess molten metal M to the molten metal recovery section 8a, the operation of the gas supply section 7a' is stopped by the controller 15 and the molten metal M filled into the minute space of the semiconductor wafer K is waited for to be cooled and cured.

Thereafter, under the control by the controller 15, the pressing and pressurizing mechanism 5' is driven to move the piston P upward and the lifting mechanism 16 is driven to move the holding table H downward, and finally the semiconductor wafer K is detached from the holding table H.

Thus, according to the metal filling apparatus 30, filling the processing chamber 2 with the molten metal M completely prevents the molten metal M from being repelled on the surface of the semiconductor wafer K and therefore it is possible to uniformly cover the entire of the surface of the semiconductor wafer K with the molten metal M. Further, moving the piston P toward the semiconductor wafer K with the processing chamber 2 completely filled with the molten metal M makes it possible to press the molten metal M into the minute space of the semiconductor wafer K, and further, since the pressing portion 6a is pressed onto the surface of the semiconductor wafer K, the function of the molten metal sealing portion 6a also makes it possible to press the molten metal M into the minute space of the semiconductor wafer K, and therefore metal filling can be effectively performed.

Further, since excess molten metal is pressed out from the surface of the semiconductor wafer K by pressing the pressing portion 6 onto the surface of the semiconductor wafer K, it is possible to reduce the amount of residue formed on the surface of the semiconductor wafer K after processing.

Further, since providing the molten metal sealing portion 6a makes it possible to confine the molten metal M in the region inside the molten metal sealing portion 6a, it is possible to discharge only excess molten metal M' in the regions other than the region to the molten metal recovery section 8a by the gas feeding mechanism 7a', thereby preventing the occurrence of problems such as that, after processing, excess molten metal is cured in a gap between the inner peripheral surface of the housing C and the outer peripheral surface of the pressing portion 6 and thereby prevents the upward and downward movement of the piston P, and that the semiconductor wafer K and the housing C stick to each other.

Furthermore, since, in the metal filling apparatus 30, the capacity of the processing chamber 2 can be made as small as possible by causing the piston P to approach the semiconductor wafer K held on the holding table H, the amount of the molten metal M to be supplied into the processing chamber 2 can be suppressed, and therefore it is possible to suppress increase in apparatus costs and running costs, such as enlargement of the capacity of a heating mechanism necessary for storing a metal in a liquid form, increase in the consumption of materials, and the like.

It is noted that, although explanation was made to the metal filling apparatus 30 having the configuration in which, by interposing the throttle of the control valve 8b, the excess molten metal M' is pressed out from the processing chamber 2 with the molten metal M maintained at the pressurized state, the configuration thereof is not limited thereto and the metal filling apparatus 30 may have, for example, a configuration in which the excess molten metal M' is pressed out by moving the piston P in a state where the molten metal recovery section 8a is equilibrated and pressurized by an inert gas or the like so that the molten metal M in the processing chamber 2 is maintained at the pressurized state.

Further, the above-described two metal filling apparatus 1, 30 have the configuration in which the supply of the molten metal M into the processing chamber 2 and the exhausting of the processing chamber 2 are performed through the pipings provided passing through the side wall of the housing C, their configurations are not limited thereto and they each may have a configuration in which the supply of the molten metal M into the processing chamber 2 and the exhausting of the processing chamber 2 are performed through pipings formed on the piston P so that they have an opening in the surface facing the surface of the semiconductor wafer K of the piston P. A metal filling apparatus 40 having such a configuration will be described below with reference to FIGS. 16 to 21. It is noted that the same components as those of the metal filling apparatuses 1, 30 are indicated by the same references and detailed explanations thereof are omitted.

Figure 16:
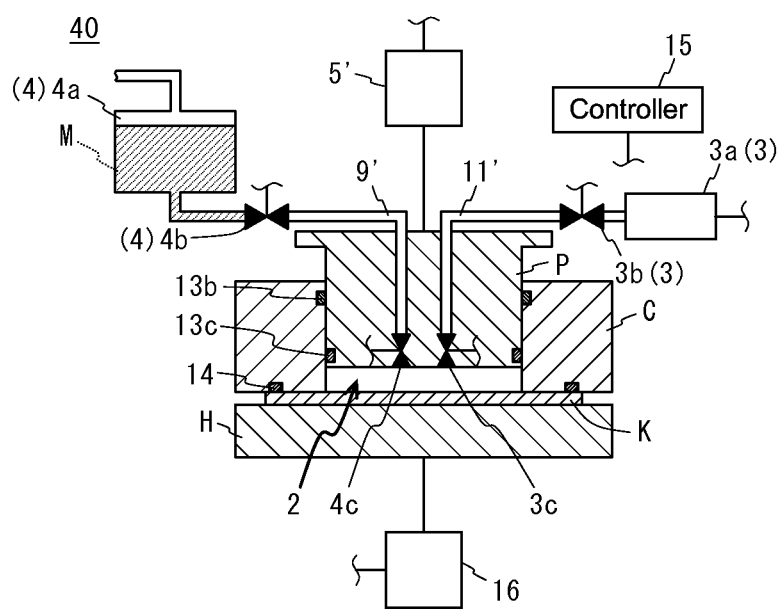
FIG. 16 is a sectional view showing a schematic configuration of a metal filling apparatus according to a further embodiment of the present invention.
Figure 17:
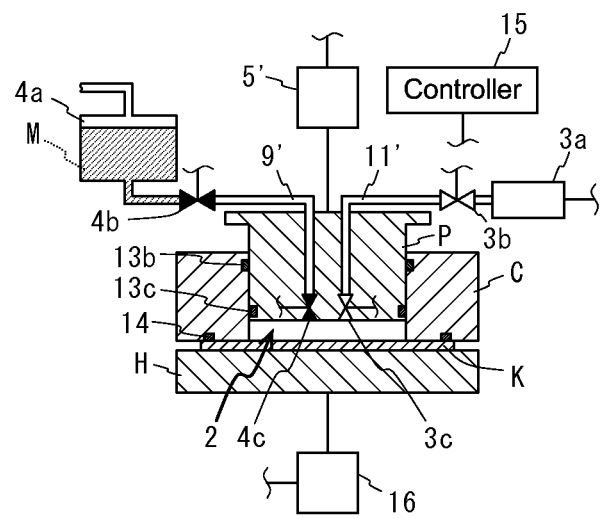
FIG. 17 is an illustration showing an operation flow of the metal filling apparatus according to the further embodiment.

As shown in FIG. 16, the metal filling apparatus 40 comprises a holding table H, a housing C, a piston P, a lifting mechanism 16, a pressing and pressurizing mechanism 5', a pressure reducing mechanism 3, a molten metal supply mechanism 4 and a controller 15.

The vacuum pump 3a and the processing chamber 2 are connected to each other through a piping 11' one end of which is open in the vicinity of the center of the surface facing the surface of the semiconductor wafer K held on the holding table H of the piston P, and the gas inside the processing chamber 2 is exhausted through the piping 11'. Further, the molten metal supply section 4a and the processing chamber 2 are similarly connected to each other through a piping 9' one end of which is open in the vicinity of the center of the surface facing the surface of the semiconductor wafer K of the piston P, and the molten metal M is supplied into the processing chamber 2 through the piping 9'. Furthermore, a valve gate 3c the opening and closing of which is controlled by the controller 15 is provided at the piston P side opening of the piping 11', and a valve gate 4c the opening and closing of which is controlled by the controller 15 is similarly provided and at the piston P side opening of the piping 9'.

Further, two O-rings 13b, 13c are interposed between the piston P and the housing C, and the O-ring 13c is fixed to a lower end portion of the piston P and the O-ring 13b is fixed to an upper end portion of the housing C.

It is noted that, although the piston P of the metal filling apparatus 40 is configured to have no pressing portion provided on the side facing the holding table H thereof, in a case where a pressing portion is provided, the piston P may be configured so that the one ends of the two pipings 9', 11' are open in the vicinity of the center of the surface of the pressing portion facing the surface of the semiconductor wafer K held on the holding table H.

Next, a procedure of filling a molten metal M into a minute space of a semiconductor wafer K by the metal filling apparatus 40 will be described with reference to FIGS. 17 to 21.

First, under the control by the controller 15, the holding table H is moved downward by driving the lifting mechanism 16 and a semiconductor wafer K is placed on the holding table H, and then the holding table H is moved upward by the lifting mechanism 16 and thereby the surface of the semiconductor wafer K is brought into contact with the lower end surface of the housing C, thereby forming an airtight processing chamber 2. Thereafter, under the control by the controller 15, the pressing and pressurizing mechanism 5' is driven to bring the piston P closer to the semiconductor wafer K held on the holing table H so that the capacity of the processing chamber 2 becomes as small as possible. Thereafter, the vacuum pump 3a is driven by the controller 15 and the control valve 3b and the valve gate 3c of the piping 11' are opened and the gas within the processing chamber 2 is exhausted to reduce the pressure inside the processing chamber 2 into an almost vacuum state (see FIG. 17).

Figure 18:
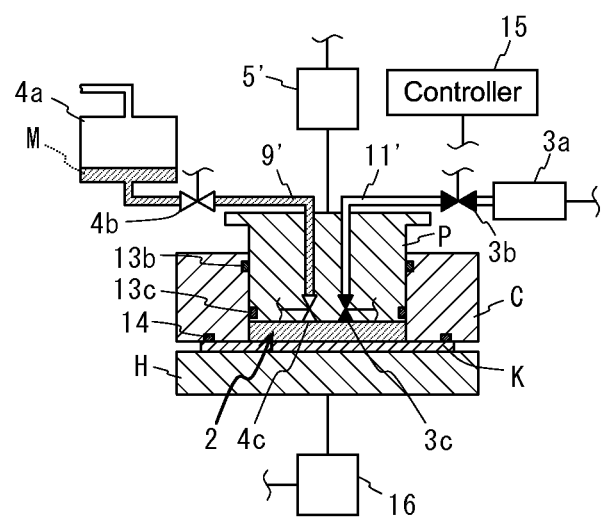
FIG. 18 is an illustration showing the operation flow of the metal filling apparatus according to the further embodiment.

Subsequently, as shown in FIG. 18, the control valve 3b and the valve gate 3c are closed by the controller 15 and the operation of the vacuum pump 3a is also stopped. Then, while maintaining the pressure-reduced state inside the processing chamber 2, the control valve 4b and the valve gate 4c of the piping 9' are opened by the controller 15, and the molten metal M is pressurized and supplied into the processing chamber 2 from the molten metal supply section 4a and the processing chamber 2 is completely filled with the molten metal M. Similarly to the foregoing, filling the processing chamber 2 with the molten metal M completely in this way prevents the molten metal M from being repelled on the surface of the semiconductor wafer K and thereby the surface of the semiconductor wafer K is uniformly covered by the molten metal M.

Figure 19:
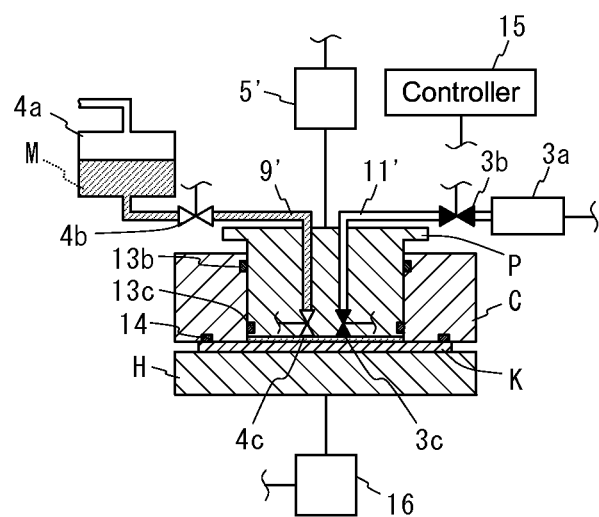
FIG. 19 is an illustration showing the operation flow of the metal filling apparatus according to the further embodiment.
Figure 20:
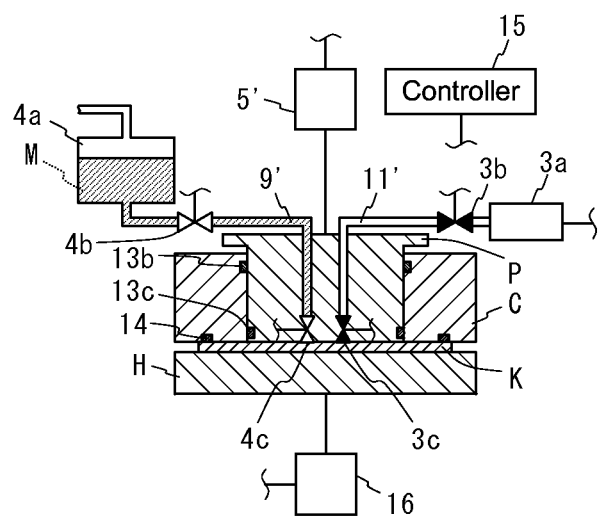
FIG. 20 is an illustration showing the operation flow of the metal filling apparatus according to the further embodiment.

Thereafter, as shown in FIG. 19, in a state where the control valve 4b and the valve gate 4c are open, under the control by the controller 15, the pressing and pressurizing mechanism 5' is driven to move the piston P toward the surface of the semiconductor wafer K. At this time, if the piston P is moved with a force larger than the supply pressure of the molten metal M at the molten metal supply section 4a to reduce the capacity of the processing chamber 2 and press that the molten metal M back from the processing chamber 2 to the molten metal supply section 4a, the state where the molten metal M is pressurized with the same pressure as the supply pressure is maintained. Further, excess molten metal M is pressed back to the molten metal supply section 4a through the piping 9' by moving the piston P with a force larger than the supply pressure of the molten metal M as described above.

Then, the piston P is further moved and pressed onto the semiconductor wafer K, and is left as it is in this state (see FIG. 20), and then the control valve 4b and the valve gate 4c are closed by the controller 15, and the molten metal M is cooled until its temperature becomes equal to or lower than its melting point, and the molten metal M filled into the minute space of the semiconductor wafer K is waited for to be cooled and cured.

It is noted that, in a case where a pressure capable of filling the metal into the minute space without the occurrence of a void cannot be obtained with the supply pressure at the molten metal supply section 4a, closing the valve gate 4c before pressing the piston P onto the semiconductor wafer K and further pressurizing the molten metal M confined in the processing chamber 2 using the piston P makes it possible to obtain a pressure capable of filling the metal into the minute space without the occurrence of a void. In this case, the timing of closing the valve gate 4c is controlled by the controller 15 so that excess molten metal on the semiconductor wafer K is minimized. Then, the molten metal M is cooled in this state until its temperature becomes equal to or lower than its melting point, and the molten metal M filled into the minute space of the semiconductor wafer K is waited for to be cooled and cured.

Figure 21:
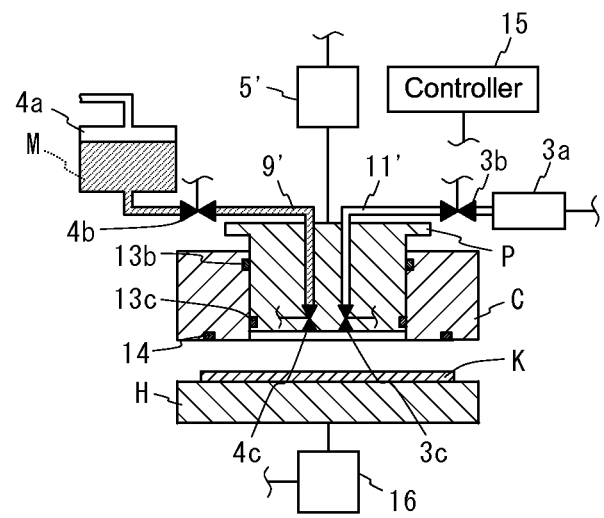
FIG. 21 is an illustration showing the operation flow of the metal filling apparatus according to the further embodiment.

Thereafter, as shown in FIG. 21, under the control by the controller 15, the pressing and pressurizing mechanism 5' is driven to move the piston P upward and the lifting mechanism 16 is driven to move the holding table H downward, and thereby the processing chamber 2 is released, and finally the semiconductor wafer K is detached from the holding table H.

Thus, also in the metal filling apparatus 40, since the processing chamber 2 is completely filled with the molten metal M, the molten metal M is prevented from being repelled on the surface of the semiconductor wafer K and thereby the entire of the surface of the semiconductor wafer K is uniformly covered by the molten metal M. Further, since the piston P is moved toward the semiconductor wafer K in a state where the processing chamber 2 is completely filled with the molten metal M, the molten metal M can be filled into the minute space. Furthermore, since the piston P is pressed onto the surface of the semiconductor wafer K and thereby excess molten metal M on the semiconductor wafer K is pressed out from the semiconductor wafer K toward the molten metal supply section 4a, it is possible to reduce the amount of residue formed on the surface of the semiconductor wafer K after processing.

Further, by setting the capacity of the processing chamber 2 to be small, as described above, the amount of the molten metal M to be supplied into the processing chamber 2 can be suppressed, thereby suppressing increase in apparatus costs and running costs.

Further, in the metal filling apparatus 40, since no piping is connected to the housing C, it is possible to arrange the O-ring 13c in the vicinity of the pressing surface of the piston P, and therefore it is possible to set the gap between the housing C and the piston P in the processing chamber 2 to be as small as possible. Thereby, even if the step of discharging the molten metal M remaining in the gap is omitted, it is possible to avoid the problem that the housing C and the piston P stick to each other due to a cured metal, and further it is possible to expand the effective processing area by employing a configuration in which no sealing portion is provided on the pressing portion.

It is noted that, although the metal filling apparatus 40 has the configuration in which two pipings are provided on the piston P, it may have a configuration in which one of the two pipings is provided on the piston P and the other is provided on the housing C. In this case, the supply of the molten metal and the exhausting of the processing chamber 2 may be performed through the piping provided on the piston P and through the piping provided on the housing C, respectively, or on contrast, the exhausting of the processing chamber 2 and the supply of the molten metal may be performed through the piping provided on the piston P and through the piping provided on the housing C, respectively.

Figure 22:
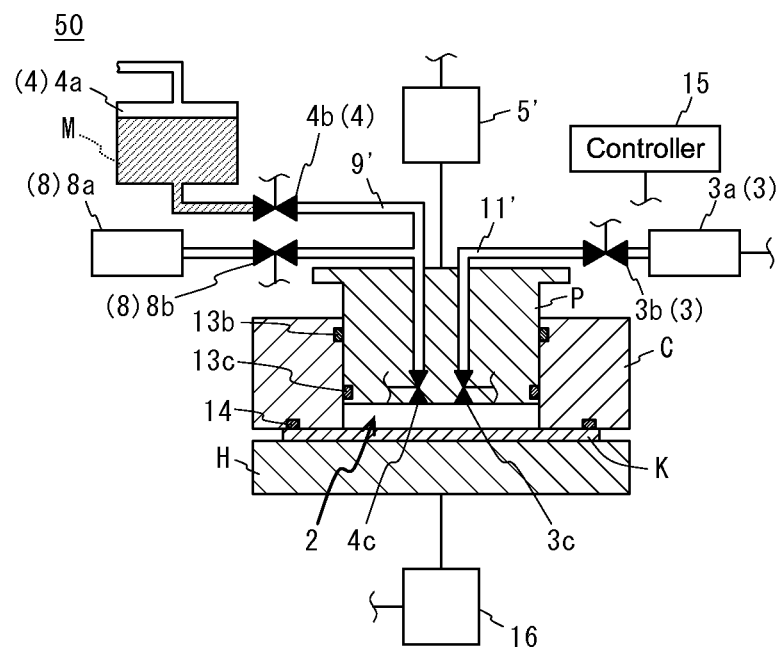
FIG. 22 is a sectional view showing a schematic configuration of a metal filling apparatus according to another further embodiment of the present invention.

Further, in the metal filling apparatus 40, in a case where it is not preferred to reuse the molten metal M supplied into the processing chamber 2, a molten metal recovery mechanism 8 may be provided like a metal filling apparatus 50 as shown in FIG. 22. Further, in this case, the molten metal recovery section 8a of the molten metal recovery mechanism 8 may be configured to recover excess molten metal M in the processing chamber 2 through the piping 9' or may be configured to recover excess molten metal M through a piping separately formed on the piston P. Furthermore, in the metal filling apparatuses 1, 30, in a case where the molten metal is reused, similarly to the metal filling apparatus 40, excess molten metal may be returned to the molten metal supply section without separately providing the molten metal recovery section.

INDUSTRIAL APPLICABILITY

As described above, the present invention is preferably applied to a metal filling apparatus for filling a molten metal into a minute space (via, though hole) on an object to be processed.

What is claimed is:

1. Apparatus for filling a molten metal into a minute space formed on a surface of an object to be processed, the minute space having an opening on said surface, the molten metal being supplied onto the object to be processed,
the metal filling apparatus comprising:
a holder holding the object to be processed;
a cylindrical member having an inner space and having open ends at both ends thereof, the cylindrical member being provided to have one end facing the holder;
a piston fitted into the inner space of the cylindrical member from one of the open ends to be movable in a forward and backward direction;
a first actuator configured to move the piston an axial direction thereof; and
a second actuator connected to at least one of the holder and the cylindrical member and configured to apply a power to the at least one of the holder and the cylindrical member so that the holder and the cylindrical member move relative to one another in approaching and separating directions,
the cylindrical member and the holder being brought into contact with each other in an unengaged manner or being caused to hold the object to be processed between them by driving the second actuator to move the cylindrical member and the holder relative to one another, so as to form an airtight processing chamber, the airtight processing chamber being formed by the object to be processed held by the holder or the holder, the cylindrical member and the piston,
the metal filling apparatus further comprising:
an exhaust pump reducing a pressure inside the processing chamber;
a molten metal supply fluidly communicating with the processing chamber; and
a pressure source fluidly communicating with the processing chamber to pressurize the molten metal supplied into the processing chamber,
the first actuator being configured to move the piston in the forward and backward direction with respect to the object to be processed held by the holder, and when moving the piston forward, move the piston forward until the piston is brought into contact with the object to be processed, and the capacity of the processing chamber being changed in accordance with the position of the piston in the forward and backward direction.

2. The metal filling apparatus according to claim 1, in which the piston includes a molten metal sealing portion configured to confine the molten metal supplied by the molten metal supply between the piston and the surface of the object to be processed.

3. The metal filling apparatus according to claim 1, in which the metal filling apparatus has a vent passage one end of which opens to an inner wall surface of the cylindrical member, and a supply passage one end of which opens to the inner wall surface of the cylindrical member, the exhaust pump is configured to reduce the pressure inside the processing chamber by exhausting a gas inside the processing chamber through the vent passage, and the molten metal supply is configured to supply the molten metal into the processing chamber through the supply passage.

4. The metal filling apparatus according to claim 3, in which the piston includes a molten metal sealing portion configured to confine the molten metal supplied by the molten metal supply between the piston and the surface of the object to be processed.

5. The metal filling apparatus according to claim 1, in which:

the metal filling apparatus has a vent passage which is formed on the piston so that one end thereof opens to a surface facing the holder of the piston, and a supply passage which is formed on the piston so that one end thereof opens to the surface facing the holder of the piston, the exhaust pump is configured to reduce the pressure inside the processing chamber by exhausting a gas inside the processing chamber through the vent passage, and the molten metal supply is configured to supply the molten metal into the processing chamber through the supply passage.

6. The metal filling apparatus according to claim 5, in which the piston includes a molten metal sealing portion configured to confine the molten metal supplied by the molten metal supply between the piston and the surface of the object to be processed.

7. The metal filling apparatus according to claim 1, in which the pressure source comprises a pressurized gas supply fluidly communicating with the processing chamber.

8. The metal filling apparatus according to claim 7, in which the gas supply comprises a gas supply tank and a piping connected to the gas supply tank, the gas supply tank and the piping being configured to supply a gas into the processing chamber, and is configured to supply a gas by operation of the gas supply tank and/or the piping.

9. The metal filling apparatus according claim 1, in which the molten metal supply is configured to supply the molten metal into the processing chamber so that the processing chamber is completely filled with the molten metal, and the first actuator also functions as the pressure source and is configured to pressurize the molten metal supplied into the processing chamber.

10. The metal filling apparatus according to claim 1, in which the molten metal supply is configured to pressurize and supply the molten metal into the processing chamber so that the processing chamber is completely filled with the molten metal, and also functions as the pressure source and is configured to pressurize the molten metal supplied into the processing chamber.

11. The metal filling apparatus according to claim 1, in which the first actuator is a cylinder.

12. The metal filling apparatus according to claim 1, in which the second actuator is a motor.

13. The metal filling apparatus according to claim 1, in which the molten metal supply comprises a molten metal supply tank and a piping connected to the molten metal supply tank.

14. The metal filling apparatus according to claim 1, in which the pressure source is configured to pressurize the molten metal supplied into the processing chamber by operation of the piston or operation of a molten metal supply tank and/or a piping connected to the molten metal supply tank.

15. The metal filling apparatus according to claim 1, further comprising a controller controlling operations of the first actuator, the second actuator, the exhaust pump, the molten metal supply and the pressure source, the controller being configured to execute:

control for bringing the cylindrical member and the holder into contact with each other in the unengaged manner or causing the cylindrical member and the holder to hold the object to be processed between them by driving the second actuator with the piston fitted in the other end side of the cylindrical member to move the cylindrical member and the holder in the approaching direction, thereby forming the airtight processing chamber;

control for reducing the pressure inside the processing chamber by driving the exhaust pump;

control for supplying the molten metal into the processing chamber by driving the molten metal supply;

control for moving the piston to a position close to the object to be processed by driving the first actuator;

control for pressurizing the molten metal in the processing chamber by driving the pressure source; and control for moving the piston until the piston is brought into contact with the object to be processed by driving the first actuator.

16. Apparatus for filling a molten metal into a minute space formed on a surface of an object to be processed, the minute space having an opening on said surface, the molten metal being supplied onto the object to be processed, the metal filling apparatus comprising:

a holder holding the object to be processed;

a cylindrical member having an inner space and having open ends at both ends thereof, the cylindrical member being provided to have one end facing the holder;

a piston fitted into the inner space of the cylindrical member from one of the open ends to be movable in a forward and backward direction;

a first actuator configured to move the piston in an axial direction thereof; and a second actuator connected to at least one of the holder and the cylindrical member and configured to apply a power to the at least one of the holder and the cylindrical member so that the holder and the cylindrical member move relative to one another in approaching and separating directions, the cylindrical member and the holder being brought into contact with each other in an unengaged manner by driving the second actuator to move the cylindrical member and the holder relative to one another, so as to form an airtight processing chamber, the airtight processing chamber being formed by the holder, the cylindrical member and the piston the metal filling apparatus further comprising:
- an exhaust pump reducing a pressure inside the processing chamber;
- a molten metal supply in fluid communication with the processing chamber; and
- a pressure source fluidly communicating with the processing chamber to pressurize the molten metal supplied into the processing chamber, the piston having a molten metal sealing portion provided thereon, the molten metal sealing portion being configured to confine the molten metal supplied by the molten metal supply between the piston and the surface of the object to be processed, and the first actuator being configured to move the piston in the forward and backward direction with respect to the object to be processed held by the holder, and when moving the piston forward, move the piston forward until the molten metal sealing portion is brought into contact with the holder.

17. The metal filling apparatus according to claim 16, further comprising a controller controlling operations of the first actuator, the second actuator, the exhaust pump, the molten metal supply and the pressure source, the controller being configured to execute:
- control for bringing the cylindrical member and the holder into contact with each other in the unengaged manner by driving the second actuator with the piston fitted in the other end side of the cylindrical member to move the cylindrical member and the holder in the approaching direction, thereby forming the airtight processing chamber;
- control for reducing the pressure inside the processing chamber by driving the exhaust pump;
- control for supplying the molten metal into the processing chamber by driving the molten metal supply;
- control for moving the piston to a position close to the object to be processed by driving the first actuator;
- control for pressurizing the molten metal in the processing chamber by driving the pressure source; and
- control for moving the piston until the molten metal sealing portion is brought into contact with the holder by driving the first actuator.

* * * * *